United States Patent [19]

Wheatley, Jr.

[11] 3,873,933

[45] Mar. 25, 1975

[54] CIRCUIT WITH ADJUSTABLE GAIN CURRENT MIRROR AMPLIFIER

[75] Inventor: Carl Franklin Wheatley, Jr., Somerset, N.J.

[73] Assignee: RCA Corporation, New York, N.Y.

[22] Filed: Nov. 8, 1973

[21] Appl. No.: 414,164

[52] U.S. Cl. .............................. 330/30 D, 330/38 M

[51] Int. Cl. ............................................. H03f 3/68

[58] Field of Search ....... 307/218, 247 R; 330/30 D, 330/38 M; 328/142, 143, 144

[56] References Cited

UNITED STATES PATENTS

| | | | |
|---|---|---|---|
| 2,401,404 | 6/1946 | Bedford | 328/144 X |
| 2,895,046 | 7/1959 | Martin | 328/142 |
| 3,500,224 | 3/1970 | Greeson | 330/38 M |
| 3,509,364 | 4/1970 | Buckley | 330/38 M |
| 3,701,032 | 10/1972 | Steckler | 330/38 M |
| 3,717,821 | 2/1973 | Amemita et al. | 330/30 D |
| 3,725,673 | 4/1973 | Frederiksen et al. | 330/30 D |

OTHER PUBLICATIONS

Designs/Functions/Active, EDN, Feb. 15, 1971, pp. 33–38, "Matched Designs–Key to Linear IC'S," by Sullivan et al.

*Primary Examiner*—Stanley D. Miller, Jr.
*Attorney, Agent, or Firm*—H. Christoffersen; S. Cohen; A. L. Limberg

[57] ABSTRACT

An adjustable-gain current mirror amplifier comprises the parallel connected fixed gain current mirror amplifier and an adjustable-gain current amplifier. No appreciable off-set potential in input voltage is required to accommodate trimming of the adjustable-gain current mirror amplifier gain.

17 Claims, 3 Drawing Figures

CIRCUIT WITH ADJUSTABLE GAIN CURRENT MIRROR AMPLIFIER

Figure 2:
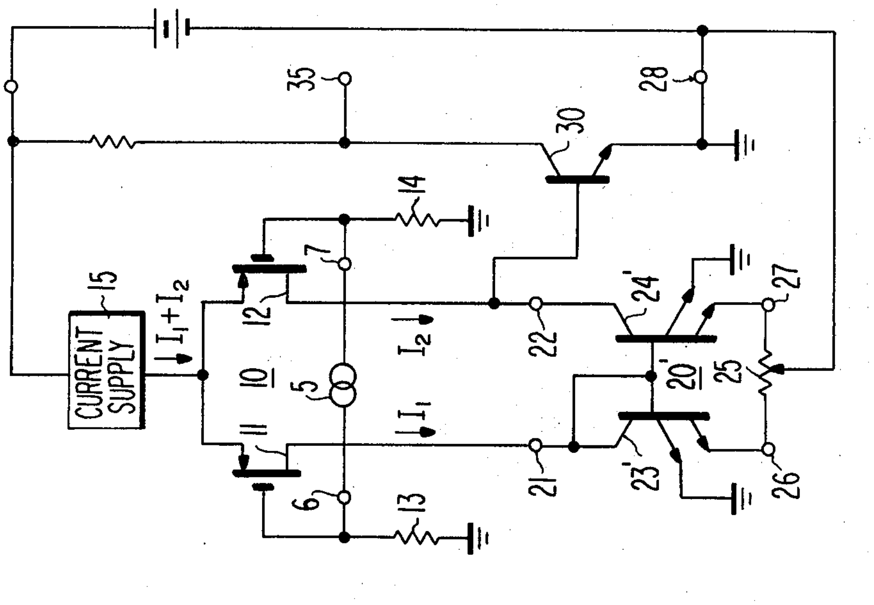

The present invention concerns current mirror amplifiers and, more particularly, is directed to providing means for trimming their current gains—that is, means for adjusting their current gains over small ranges to their correct, nominal values.

A current mirror amplifier is a current amplifier with a current gain of minus unity and is commonly used in integrated circuitry. The input circuit to the mirror customarily exhibits a low impedance, and the output circuit a high impedance. A variation in the input current applied to the input circuit results in a similar though oppositely directed variation in the current produced at the output circuit. The current mirror amplifier typically includes a first and second transistors having their collector electrodes coupled to an input and an output terminals, respectively. These transistors have similar base-emitter circuits, which are biased in common by a negative feedback circuit coupling the collector electrode of the first transistor to its base electrode. The negative feedback circuit regulates the collector current of the first transistor to be substantially the same as current applied to the input terminal. Because of the similarity of the conditions imposed upon their base-emitter junctions, substantially equal collector currents flow through the input and output terminals of the current mirror amplifier to or from the collector electrodes of the first and second transistors, respectively. The second transistor thus supplies an output signal current from its collector electrode to the output terminal, which output signal current is substantially equal and opposite to the input signal current accepted by the first transistor collector electrode. Current mirror amplifiers are often employed as active loads for emitter-coupled or source-coupled differential amplifier transistors and in that role constructively combine the differential amplifier output currents.

A commonly used means of trimming the current gain of a current mirror amplifier used as an active load for a differential amplifier is to provide its first and second transistors with adjustable emitter degeneration resistances. This gain trimming arrangement is disadvantageous in that it causes the potential across the input circuit of the current mirror amplifier to change as the gain is adjusted. This makes it more difficult to keep equal quiescent potentials on the differential amplifier transistors, which is necessary to minimize input offset potential errors appearing at their control electrodes (that is, their base or gate electrodes).

Aspects of this problem in differential amplifier design were pointed out by O. H. Schade, Jr. in U.S. Pat. application Ser. No. 318,646 now U.S. Pat. No. 3,852,679 filed Dec. 26, 1972 entitled "Improvement for Current Mirror Applications" and assigned, like the present application, to RCA Corporation. However, the solutions put forth by O. H. Schade, Jr. are not suitable when means must be provided for adjusting the gain of the current mirror amplifier load of a differential amplifier.

An adjustable-gain current mirror amplifier embodying the present invention comprises the parallel connection of a fixed-gain current mirror amplifier and an adjustable-gain current amplifier.

Figure 1:
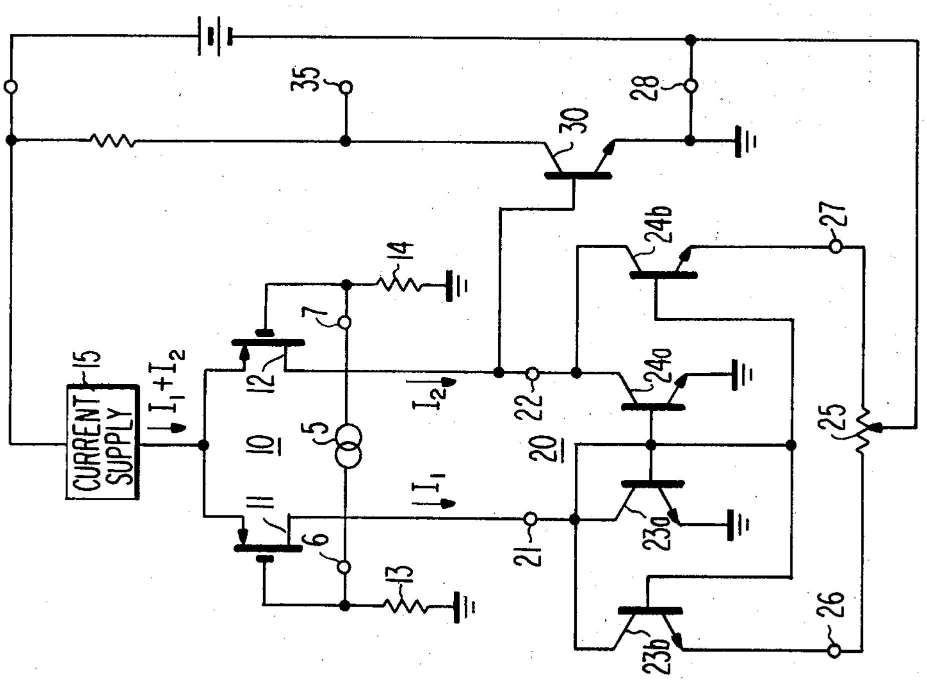
Figure 3:
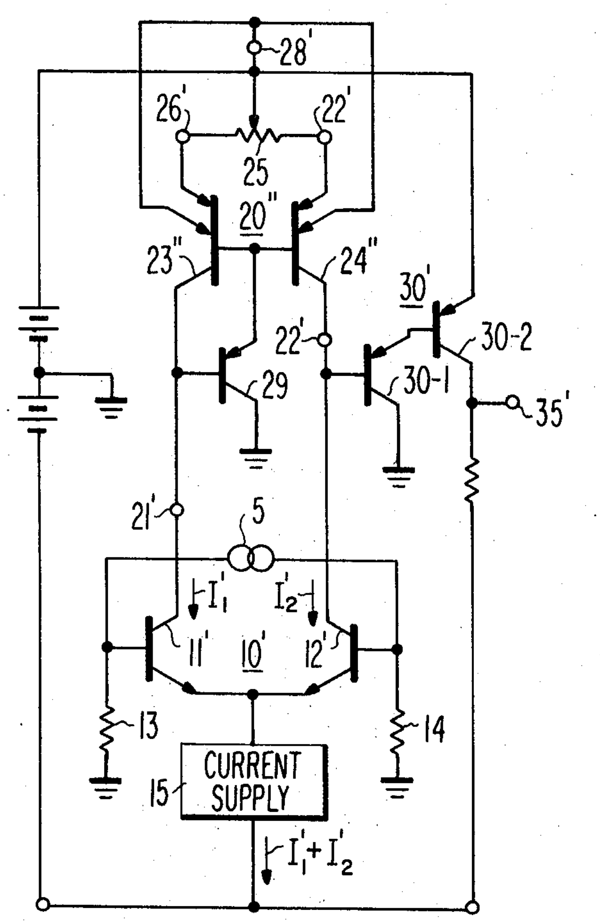

In the drawing,

FIGS. 1, 2, and 3 are schematic diagrams of various embodiments of the present invention.

FIG. 1 shows a configuration in which the present invention is used to good advantage. A source 5 of input signals applied to a differential amplifier 10 causes the amplifier to produce output currents with equal and opposite current variations. These output currents are applied to a current mirror amplifier 20 which constructively combines the current variations for application to a subsequent grounded-emitter transistor amplifier 30.

The current mirror 20 should withdraw quiescent currents $I_1$, $I_2$ which are as nearly equal as possible from the differential amplifier 10. Furthermore, the potentials presented at the input terminal 21 and output terminal 22 of the current mirror 20 should be equal. Fulfilling these requirements avoids applying different biasing conditions to the component transistors 11, 12 of the differential amplifier 10. Such different biasing conditions would cause the transconductance of the transistors 11, 12 to differ from each other and so result in an undesirable potential offset between input terminals 6, 7 of the differential amplifier 10.

The transistors in the differential amplifier 10 are shown as being PMOS field-effect transistors 11, 12 which are preferred in many designs because of their high input impedance compared to bipolar devices. In general, it is more critical that the amplitudes of the quiescent currents $I_1$, $I_2$ supplied to the current mirror amplifier be equal when the differential amplifier 10 uses source-coupled PMOS transistors, as shown, than when it uses emitter-coupled PNP bipolar transistors. The reason is that the MOS transistors have a substantially lower transconductance than bipolar transistors at most current levels, so a slight mismatch of quiescent output currents $I_1$, $I_2$ causes a higher differential input offset voltage in a differential amplifier using MOS transistors than in one using bipolar transistors.

To provide simple input bias circuitry and to facilitate direct coupling from signal sources referred to ground reference potential, the gate electrodes of the transistors 11, 12 are quiescently biased to ground reference potential by resistors 13, 14. The interconnected source electrodes of transistors 11, 12 are supplied quiescent source current $I_1 + I_2$ from a current source 15. Since the gate electrodes of PMOS transistors 11, 12 are biased near the drain supply potential, the resultant restricted drain-to-source potential places them in a region where their output resistance and transconductance are substantially reduced as device saturation is approached. This also increases differential input voltage offset between the gate electrodes of transistors 11, 12 should their drain currents $I_1$, $I_2$ be mismatched.

Too, the NPN transistors 23*a*, 23*b*, 24*a*, 24*b* in the current mirror amplifier are operated at collector-emitter potentials of only about one base-emitter offset potential ($1V_{BE}$, about 650 millivolts), which is not far removed from collector saturation potential (say, 100 to 200 millivolts). As temperature increases slightly, the $1V_{BE}$ collector-to-emitter potential falls, approaching a rising saturation potential more closely. This tends to cause the current mirror amplifier 20 to withdraw less well-balanced currents $I_1$, $I_2$ from the drain electrodes of transistors 11, 12.

The single direct connection between the collector electrodes of transistors 23*a* and 23*b* and their base electrodes is electrically equivalent to separate direct connections between the collector and base electrodes of each of them. Viewed in this manner, transistors 23*a* and 24*a* form a fixed-gain current mirror amplifier in parallel connection with an adjustable-gain current amplifier formed by transistors 23*b* and 24*b* and potentiometer 25. It is important to realize, however, that there are biasing interactions of between on one hand transistors 23*a* and 24*a* and on the other hand, transistors 23*b* and 24*b*.

Transistors 23*a* and 24*b* of current mirror amplifier 20 are connected base-to-base and emitter-to-emitter, which causes their base-emitter potentials to be identical. Assuming the transistors 23*a* and 24*a* to have matched operating characteristics and to be tightly coupled thermally, their identical base-emitter potentials will cause their collector currents to be equal. Transistor 23*a* is provided degenerative collector-to-base feedback by the connection of its base electrode to its collector electrode, which feedback regulates its collector current $I_{C23a}$, to accept a substantial portion of current $I_1$. Other portions of $I_1$, $I_{B23a}$ and $I_{B24a}$, flow as base currents to transistors 23*a* and 24*a*, respectively. $I_{B23a}$ is smaller than $I_{C23a}$ by a factor $h_{fe23a}$, the common-emitter forward current gain of transistor 23*a*. $I_{B24}$ substantially equals $I_{B23a}$. So, if transistors 23*b* and 24*b* were absent, the current flowing into terminal 21 would exceed that flowing into terminal 22 by a factor $(h_{fe23a} + 2)/h_{fe23a}$.

$I_2$ includes $I_{B30}$, the base current of transistor 30, as well as $I_{C24a}$, however. If $I_{B30}$ equaled $(I_{B23a} + I_{B24a})$, $I_1$ would equal $I_2$ without need for the trimming afforded by the adjustable collector currents of transistors 23*b* and 24*b*. (This desirable type of operation was first described and claimed in my U.S. Pat. application Ser. No. 391,664 now U.S. Pat. No. 3,851,241 filed Aug. 27, 1973; entitled "Temperature Dependent Voltage Reference Circuit" and assigned, like the present application, to RCA Corporation. However, this equality of $I_{B30}$ and $(I_{B23a} + I_{B24a})$ will usually not obtain for some portion of a production run using present-day processing techniques. The matching of transconductance characteristics of transistors in integrated circuits, while good, is not perfect. Equality of $I_{B30}$ and $(I_{B23a} + I_{B24a})$ may not even be an objective of the design, when there are reasons for choosing some other current levels for transistor 30.

For the reasons discussed above, the need arises to provide for minor correction or "trimming" of the currents flowing through terminals 21 and 22. The collector currents of transistors 23*b* and 24*b* can be adjusted to provide these minor adjustments according to the present invention.

In the discussion which follows, transistors 23*b* and 24*b* are assumed to have matched characteristics like those of transistors 23*a* and 24*a*. Such an assumption is valid, for example, when these transistors are part of a monolithic integrated circuit. Transistors 24*a* and 24*b* have the same base potentials because their base electrodes are connected together. Their emitter electrodes are connected to terminals 26 and 27, respectively, to which separate ends of the resistive body of a potentiometer 25 are respectively connected. The adjustable tap of the potentiometer 25 is connected to a ground terminal 28, to which the emitter electrodes of transistors 23*a*, 24*a* and 30 are also connected. Adjusting the potentiometer 25 changes the emitter degeneration resistances of transistors 23*b* and 24*b*, increasing one while decreasing the other or vice versa. The collector current of the transistor with the larger emitter degeneration resistance is smaller than that of the transistor with the smaller emitter degeneration resistance.

Transistors 23*a* and 24*a* have a voltage $V_{21}$ (the potential at terminal 21 with respect to ground reference potential) directly impressed across their base-emitter junctions, and this same voltage is impressed across the series combinations of the base-emitter junctions of transistors 23*b* and 24*b* with their respective portions of the resistance of potentiometer 25.

$$V_{BE23a} = V_{BE23b} + I_{E23b} R_{23b} \tag{1}$$

$$V_{BE24a} = V_{BE24b} + I_{E24b} R_{24b} \tag{2}$$

where:

$V_{BE23a}$ is the base-emitter potential of transistor 23*a*,
$V_{BE23b}$ is the base-emitter potential of transistor 23*b*,
$I_{E23b}$ is the emitter current of transistor 23*b*,
$R_{23b}$ is the emitter degeneration resistance of transistor 23*b*,
$V_{BE24a}$ is the base-emitter potential of transistor 24*a*,
$V_{BE24b}$ is the base-emitter potential of transistor 24*b*,
$I_{E24b}$ is the emitter current of transistor 24*b*, and
$R_{24b}$ is the emitter degeneration resistance of transistor 24*b*. A well-known expression describing transistor action is:

$$V_{BE} = \frac{kT}{q} \ln \frac{I_C}{I_S} \tag{3}$$

where:

$V_{BE}$ is the base-emitter potential of the transistor,
$K$ is Boltzmann's constant,
$T$ is the absolute temperature of the transistor,
$q$ is the charge on an electron,
$I_C$ is the collector current of the transistor, and
$I_S$ is its saturation current.

Another expression known to describe transistor action is:

$$I_C = \alpha I_E \tag{4}$$

where $\alpha$ is the common-base forward current gain of transistor and $I_E$ is its emitter current.

Equations 3 and 4 can be combined with each of equations 1 and 2 to yield:

$$\frac{I_{C23a}}{I_{C23b}} = \frac{I_{E23a}}{I_{E23b}} = \exp \frac{qI_{E23b} R_{23b}}{kT} \text{ and} \tag{5}$$

$$\frac{I_{C24a}}{I_{C24b}} = \frac{I_{E24a}}{I_{E24b}} = \exp \frac{qI_{E24b} R_{24b}}{kT} \tag{6}$$

The resistance $R_{23b} + R_{24b}$ of potentiometer 25 is chosen such that for intermediate settings of the potentiometer 25, $I_{E23a}$ will exceed $I_{E23b}$ and $I_{E24a}$ will exceed $I_{E23b}$ usually by factors of 10 times or so. The collector currents of transistors 23*b* and 24*b* will be smaller than those of transistors 23*a* and 24*a* by those same factors.

Thus, because transistor 23*a* generally has higher emitter current and consequently higher transconductance (gm) than transistor 23*b* (gm equalling approximately 40 millimhos per milliampere in a transistor), the potential $V_{21}$ is still dominated by the degenerative feedback connection of transistor 23*a* despite transistor 23*b* having been added to the basic current mirror amplifier. $V_{BE23a}$ obeys equation 3, changing very little despite a portion of $I_1$ being diverted from flowing as its collector current $I_{C23a}$. At most, a slight amount more than $I_1/2$ can be diverted from flowing as $I_{C23a}$. This occurs when potentiometer 25 is adjusted to provide zero emitter degeneration to transistor 23*b* (that is, $R_{23b} = 0$) and causes $V_{21}$ to be reduced by 18 millivolts from its normal value of about 650 millivolts. The potential at terminal 21, $V_{21}$, is held at a value which is substantially the same as the potential at terminal 22, which is determined by the base-emitter offset potential of transistor 30.

The reduction of $V_{21}$ to a value where $I_{C23a}$ is only $I_1/2$ approximately will, because transistors 23*a* and 24*a* have matched characteristics and have equal base-emitter potentials, also cause $I_{C24a}$ to be $I_1/2$, approximately. $I_{C24b}$ will be much smaller than $I_1/2$ per equation 6. The combined collector currents $I_{C24a} + I_{C24b}$ of transistors 24*a* dnd 24*b* will be a little over half as large as $I_1$.

On the other hand, consider a setting of potentiometer 25 such that $R_{24b} = 0$. Since the total resistance of the body of potentiometer 25 appears to be as an emitter degeneration resistance for transistor 23*b*, its collector current $I_{C23b}$ should be substantially smaller than $I_{C23a}$, the collector current of transistor 23*a*. Then, $V_{21}$ and $V_{BE23a}$ assume the value required to $I_{C23a}$ to be substantially equal to $I_1$. $V_{BE24a}$ being equal to $V_{21}$ and $V_{BE23a}$ and transistors 23*a* and 24*a* have matching characteristics, $I_{C23a}$ will substantially equal $I_1$. Transistor 24*b* which has no emitter degeneration resistance for the presently assumed condition has $V_{21}$ impressed directly across its base-emitter junction and responds with a collector current $I_{C24b}$ also substantially equal to $I_1$. The combined collector currents $I_{C24a}$ and $I_{C24b}$ withdrawn by transistors 24*a* and 24*b* is substantially equal to twice $I_1$.

Some intermediate position between the two limit conditions described above will cause equal $I_1$ and $I_2$ currents to flow. It has been assumed that transistors 23*b* and 24*b* has characteristics not only matched to each other but also to the operating characteristics of transistors 23*a* and 24*a*. In many instances, however, a 4:1 range of current gain adjustment is not required of current mirror amplifier 20. The base-emitter junctions of transistors 23*b* and 24*b* can be made to have smaller or larger effective areas than the base-emitter junctions of transistors 23*a* and 24*a*, which will respectively reduce or increase the range of current gain adjustment.

Transistors 23*a* and 23*b* because of their collector-to-base connections function as semiconductor diodes and may be replaced by simpler diodes each consisting of a single junction. The term "diode" in the claims is considered to indicate a diode-connected transistor, a single junction and other equivalent circuits within its scope.

FIG. 2 shows a modification of the FIG. 1 configuration. A dual-emitter transistor 23' replaces transistors 23*a* and 23*b*, which have joined base electrodes and joined collector electrodes. A dual-emitter transistor 24' replaces transistors 24*a* and 24*b*, which have joined base electrodes and joined collector electrodes. This modification saves substantial chip area when the circuit is fabricated in monolithic semiconductor integrated circuit form.

FIG. 3 shows a modification of the FIG. 2 configuration. Differential amplifier 10' comprises bipolar NPN transistors 11' and 12' in contrast to differential amplifier 10 using p-channel FET's 11 and 12. The connection of biasing elements including current supply 15 is modified to suit the different biasing requirements occasioned by the use of transistors of opposite conductivity types and the use of bipolar transistors rather than FET's. Current mirror amplifier 20'' is another well-known type which has an emitter-follower transistor 29 connected in the degenerative collector-to-base feedback connection of its input transistor 23''. This reduces the imbalance of currents flowing through terminals 21' and 22' otherwise caused by the base currents of transistors 23'' and 24''. The inclusion of transistor 29 in the degenerative collector-to-base feedback connection of transistor 23'' also causes its collector-to-emitter potential to be regulated to the sum of the base-emitter offset potentials of transistors 29 and 23''. This maintains the potential at terminal 21' with respect to that at terminal 28' substantially the same as the potential at terminal 22' with respect to that at terminal 28. This latter difference in potential is maintained by the base-emitter offset potentials of cascaded transistors 30-1 and 30-2. This cascade 30 of emitter-follower stage and common-emitter amplifier stage cooperate to provide at terminal 35 amplified signals responsive to signals appearing at terminal 22'.

While the principles of the present invention have been set forth in current mirror amplifiers using bipolar transistors, these principles are applicable to current mirror amplifiers using transistors of other types which have a principal conductive path between first and second electrodes corresponding to the emitter-to-collector path between emitter and collector electrodes of a bipolar transistor and having a control electrode corresponding to the base electrode of the bipolar transistor. The use of the present invention in current mirror amplifiers utilizing field-effect transistors (FET's) is particularly contemplated. While FET's have no gate currents analogous to transistor base currents, a current mirror amplifier using FET's may require trimming of its current gain because of the transconductances of its component FET's being not quite identical. The claims while formed in the language particularly describing bipolar transistors are to be construed in light of the foregoing paragraph to define their scope.

What is claimed is:

1. A composite current mirror amplifier having a current gain which can be trimmed, responding to an input current to supply an output current, and comprising:

a fixed gain current mirror amplifier having an input circuit and an output circuit;

an adjustable gain direct-coupled current amplifier having an input circuit and an output circuit;

means connecting the input circuits of said fixed gain current mirror amplifier and of said adjustable gain current amplifier in parallel for splitting said input current between said input circuits; and means connecting the output circuits of said fixed gain current mirror amplifier and of said adjustable gain current amplifier in parallel for supplying said output current.

2. The composite current mirror amplifier set forth in claim 1 wherein:

said fixed-gain current mirror amplifier comprises a first transistor, said first transistor having a base and an emitter electrodes with a base-emitter junction therebetween and having a collector electrode, connected in common-emitter amplifier configuration with a first diode connected transistor connected in parallel with its base-emitter junction, and said adjustable-gain current amplifier comprises a second transistor, said second transistor having a base and an emitter electrodes with a base emitter junction therebetween and having a collector electrode, connected in common-emitter amplifier configuration with a first adjustable resistive element connected in a first series combination with the base-emitter junction of said second transistor to provide emitter degeneration resistance thereto.

3. The composite current mirror amplifier set forth in claim 2 wherein said first and said second transistors are of the same conductivity type.

4. The composite current mirror amplifier set forth in claim 2 wherein said adjustable-gain current amplifier further includes:

a second diode and a second adjustable resistive element connected in a second series combination parallelly connected with said first series combination.

5. The composite current mirror amplifier set forth in claim 4 wherein:

said first and second adustable resistive elements are arranged to be mutually adjustable such that the resistance of one is increased while the other is decreased and vice versa.

6. The composite current mirror amplifier set forth in claim 5 wherein:

said first and second resistive elements are provided by a resistive potentiometer, said first resistive element being between a first end terminal of said potentiometer and its slider or tap terminal and said second resistive element being between a second end terminal of said potentiometer and its slider or tap terminal.

7. The composite current mirror amplifier set forth in claim 4 wherein at least one of said first and said second diodes each comprises an auxiliary transistor having an emitter and a collector electrodes and having a base electrode connected to its collector electrode.

8. The composite current mirror amplifier set forth in claim 2 wherein said first adjustable resistive element is connected between the emitter electrodes of said first and said second transistors.

9. The composite current mirror amplifier set forth in claim 8 wherein:

a second diode and a second adjustable resistive element are connected in a second series combination which second series combination is connected in parallel with said first series combination.

10. The composite current mirror amplifier set forth in claim 9 wherein said first and said second resistive elements are provided by a resistive potentiometer, said first resistive element being between a first end terminal of said potentiometer and its slider or tap terminal and said second resistive element being between a second end terminal of said potentiometer and its slider or tap terminal, said slider or tap terminal being connected to said first transistor emitter electrode.

11. The composite current mirror amplifier set forth in claim 4 having in combination therewith:

a third and a fourth transistors of complementary conductivity type to said first transistor, each having a base and an emitter and a collector or equivalent electrodes, and means for applying direct bias between the base and emitter electrodes of said third transistor;

means for applying direct bias between the base and emitter electrodes of said fourth transistor;

means for applying signal between the base electrodes of said third and said fourth transistors and direct current conductive connections of said third and fourth transistor collector electrodes respectively to separate ones of said first transistor base and collector electrodes.

12. The combinations set forth in claim 11 having in combination therewith:

a fifth transistor of the same conductivity type as said first transistor, said fifth transistor having a base and an emitter electrodes respectively connected to said first transistor collector and emitter electrodes and having a collector electrode, and further means connecting said fifth transistor in common-emitter amplifier configuration.

13. In combination:

a first and a second terminals for application of a first and a second input currents, respectively;

a third terminal for connection to a reference potential;

a fourth and a fifth terminals;

a first and a second and a third and a fourth transistors of the same conductivity type, each having a principal conductive path between a first and a second electrodes and having a control electrode, the conductivity of the principal conductive path of each said transistor being determined in accordance with potential applied between its control and first electrodes;

the second electrodes of said first and said third transistors being coupled to said first terminal, the second electrodes of said second and said fourth transistors being coupled to said second terminal;

the first electrodes of said first and said second transistors being connected to separate ones of said fourth and said fifth terminals, the first electrodes of said third and said fourth transistors being directly connected to said third terminal;

degenerative feedback means connecting said first terminal to each of the control electrodes of said first, said second, said third and said fourth transistors; and an adjustable potentiometer having ends connected to said fourth and said fifth terminals and a tap connected to said third terminal.

14. The combination set forth in claim 13 having in combination therewith:

a fifth and a sixth transistors of complementary conductivity type to that of said first transistor, each having a principal conductive path between a first and a second electrodes and having a control electrode, the conductivity of the principal conductive path of each being determined in accordance with the potential applied between its control and first electrodes;

means for applying direct bias between the control and first electrodes of said fifth transistor;

means for applying direct bias between the control and first electrodes of said sixth transistor;

means for applying signal between the control electrodes of said fifth and said sixth transistors; and means for direct current conductively coupling the second electrodes of said fifth and said sixth transistors to separate ones of the second electrodes of said first and said second transistors, respectively.

15. The combination set forth in claim 13 wherein said first and said third transistors are comprised within a first dual-emitter transistor structure, and said second and said fourth transistors are comprised within a second dual-emitter transistor structure.

16. A current mirror amplifier comprising:

an input terminal for receiving an input current;

an output terminal for supplying an output current, which is in substantially constant proportion to said input current;

a common terminal for return of said input current and said output current;

a transistor having a base electrode connected to said input terminal, a collector electrode connected to said output terminal, an emitter electrode connected to said common terminal, and a base-emitter junction between its said base and emitter electrodes;

a first diode, having a first end and a second end respectively connected to said input terminal and to said common terminal for parallel forward conduction with said base-emitter junction for all values of said input current of a polarity to forward-bias said base-emitter junction;

a first adjustable-resistance element;

a second diode serially connected with said adjustable-resistance element between the first and second ends of said first diode for parallel forward conduction with said base-emitter junction and said first diode, for all values of said input current of said polarity to forward bias said base-emitter junction, the adjustment of said adjustable-resistance element being over a range of resistance values to affect the flow of current through itself and said second diode to alter said substantially constant proportion.

17. A composite current mirror amplifier with current gain which can be trimmed, comprising in combination:

an input terminal for said composite current mirror amplifier;

an output terminal for said composite current mirror amplifier;

a common terminal for said composite current mirror amplifier;

a fixed gain current mirror amplifier having an input terminal connected to said input terminal for said composite current mirror amplifier, a common terminal connected to said common terminal for said composite current mirror amplifier, and an output terminal connected to said output terminal for said composite current mirror amplifier; and an adjustable gain current amplifier having an input terminal connected to said input terminal for said composite current mirror amplifier, a common terminal connected to said common terminal for said composite current mirror amplifier, and an output terminal connected to said output terminal for said composite current mirror amplifier.

* * * * *